United States Patent [19]

Furumochi

[11] Patent Number: 5,485,117
[45] Date of Patent: Jan. 16, 1996

[54] POWER CIRCUIT AND SEMICONDUCTOR DEVICE INCLUDING THE SAME

[75] Inventor: Kazuto Furumochi, Kawasaki, Japan

[73] Assignee: Fujitsu Limited, Kawasaki, Japan

[21] Appl. No.: 262,373

[22] PCT Filed: Mar. 20, 1991

[86] PCT No.: PCT/JP92/00326

§ 371 Date: Nov. 20, 1992

§ 102(e) Date: Nov. 20, 1992

[87] PCT Pub. No.: WO92/16887

PCT Pub. Date: Oct. 10, 1992

Related U.S. Application Data

[63] Continuation of Ser. No. 170,974, Dec. 21, 1993, abandoned, which is a continuation of Ser. No. 952,707, Nov. 20, 1992, abandoned.

[30] Foreign Application Priority Data

Mar. 20, 1991 [JP] Japan ................................. 3-057218

[51] Int. Cl.⁶ .................................................. G05F 1/10
[52] U.S. Cl. ............................ 327/538; 327/73; 327/543
[58] Field of Search ........................... 307/296.6, 296.8, 307/359, 219, 270, 296.1, 360, 491, 494; 323/293, 313, 317, 273, 274, 280, 281, 224, 266, 299; 327/73, 77, 87, 108–111, 530, 538, 543, 561, 563

[56] References Cited

U.S. PATENT DOCUMENTS

| | | | |
|---|---|---|---|
| 4,559,694 | 12/1985 | Yoh et al. | 307/296.8 |
| 4,649,291 | 3/1987 | Konishi | 307/297 |
| 4,990,847 | 2/1991 | Ishimaru et al. | 323/317 |
| 5,083,043 | 1/1992 | Yoshida | 307/296.8 |

FOREIGN PATENT DOCUMENTS

| | | |
|---|---|---|
| 57-098018 | 6/1982 | Japan . |
| 63-316113 | 12/1988 | Japan . |

OTHER PUBLICATIONS

IBM Technical Disclosure Bulletin vol. 31, No. 12, May 1989, New York, US, "Regulated On–Chip Voltage Converter", p. 192, paragraph 1—p. 194, paragraph 1; figures 1–2.

Patent Abstracts of Japan vol. 6, No. 183 (p. 143)(1061) 18 Jun. 1982 & JP-A-57 098 018 (Mitsubishi Denki K.K.).

Primary Examiner—Timothy P. Callahan
Assistant Examiner—Jeffrey Zweizig
Attorney, Agent, or Firm—Staas & Halsey

[57] ABSTRACT

A power circuit is suitable for inclusion into a semiconductor apparatus, for example, and follows up the noise caused by the operation of an internal load circuit. When the voltage $V_{DD}$ applied to the internal circuit changes a relatively moderate amount due to such causes as the variation of an externally supplied power supply voltage $V_{CC}$ or the operation of the internal circuit, a negative feedback is applied to a variable resistance element by a voltage comparator and a variable resistance element driver. In response to an instantaneous variation of the internal circuit applied voltage $V_{DD}$, the variation being caused by the operation of the internal circuit 100, for example, a rapid negative feedback is applied to the variable resistance element by a capacitor.

11 Claims, 5 Drawing Sheets

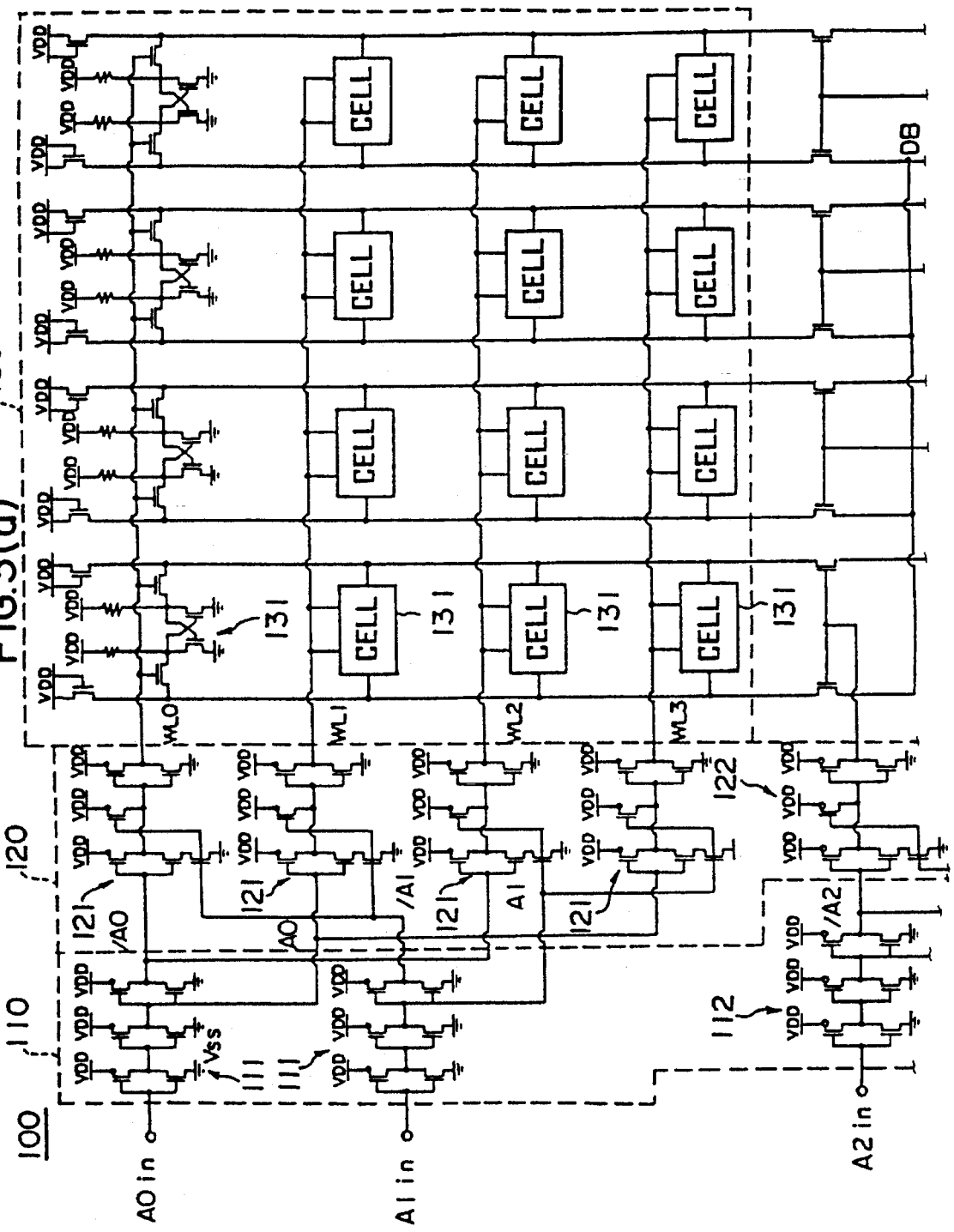

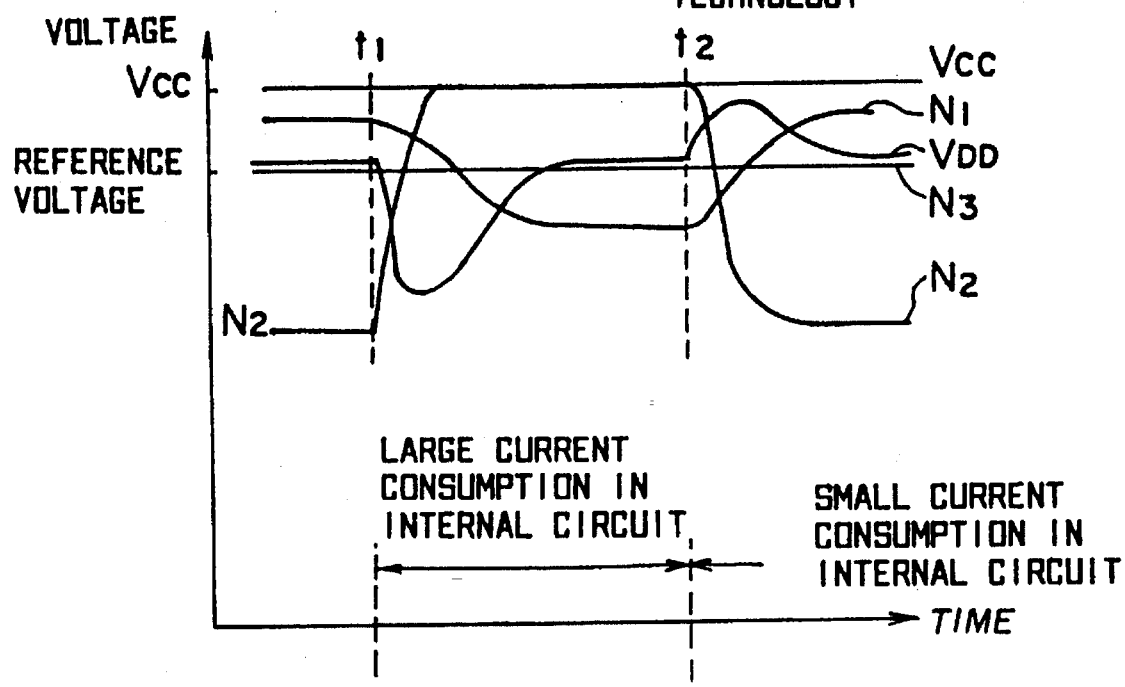
FIG. 4 (a) CONVENTIONAL TECHNOLOGY
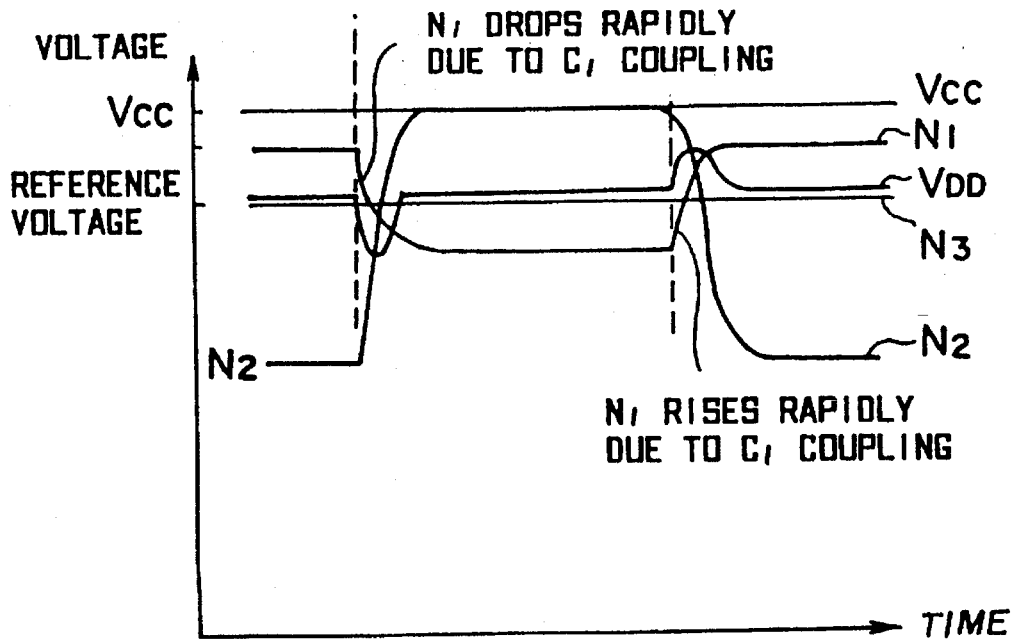
FIG. 4 (b) PRESENT INVENTION 19,485,117

POWER CIRCUIT AND SEMICONDUCTOR DEVICE INCLUDING THE SAME

This application is a continuation of application Ser. No. 08/170,974, filed Dec. 21, 1993, now abandoned, which is a continuation of application Ser. No. 07/952,707, filed Nov. 20, 1992, now abandoned.

FIELD OF THE INVENTION

The present invention pertains to a power circuit suitable for inclusion in a semiconductor apparatus which, for example, improves a follow-up characteristic with respect to noise caused by the operation of an internal load circuit.

BACKGROUND ART

Recent demand for high integration and speed-up of electric circuits requires that a semiconductor apparatus is manufactured in an increasingly refined manner. However, since the voltage used in a semiconductor apparatus does not vary in accordance with the scale of miniaturization, a problem with reliability inevitably surfaces because of the electric field concentration in a transistor of a very refined structure. Accordingly, a power supply by means of a so-called voltage drop circuit, for supplying an externally applied voltage to an internal circuit after dropping the same voltage, is desired in order to ensure reliability without changing the voltage used in a semiconductor apparatus.

Conventionally, a power circuit of this type comprises a variable resistance element, a reference voltage generating source, a comparator, and a resistance element driver, for the purpose of supplying a power supply voltage to an internal circuit.

A variable resistance element changes its value of resistance in response to a signal fed into its control input terminal and is inserted in the line which supplies power to an internal load circuit. A reference voltage generating source generates a reference voltage that serves as a reference for a voltage applied to the internal load circuit. A comparator compares the reference voltage obtained from the reference voltage generating source with an applied voltage actually applied to the internal circuit. A resistance element driver drives the variable resistance element in accordance with an output signal from the comparator, thereby maintaining the applied voltage applied to the internal circuit at the same level on the basis of the variation of the value of resistance.

In such a power circuit, when a voltage $V_{DD}$ (3V, normally) varies due to such causes as the variation of an externally supplied power supply voltage $V_{CC}$ (5V, normally) or the operation of the internal circuit, a negative feedback is applied to the variable resistance element so as to cancel the variation, with the result that the applied voltage $V_{DD}$ of the internal circuit is maintained at approximately the same level.

However, since it is impossible in such a conventional power circuit to secure a large idling current in the variable resistance element driver due to the requirement of reducing power consumption, there is a disadvantage in that a bad follow-up characteristic results with respect to an instantaneous variation (noise) of the internal circuit applied voltage $V_{DD}$, caused by the operation of the internal circuit, for example.

The present invention is designed to eliminate the above disadvantage, and the object thereof is to improve the follow-up characteristic of such a power circuit with respect to an instantaneous variation (noise) of the internal circuit applied voltage $V_{DD}$ without increasing the idling current of the variable resistance driver.

SUMMARY OF THE INVENTION

The above object can be achieved by a configuration comprising a variable resistance element having a resistance changes in response to a signal fed into its control input terminal and inserted in the line which supplies power to an internal load circuit a reference voltage generating source for generating a reference voltage that serves as a reference for an applied voltage applied to the internal circuit, a comparator for comparing the reference voltage obtained from the reference voltage generating source and the applied voltage applied to the internal circuit, a resistance element driver that drives the variable resistance element in accordance with the output signal of the comparator, thereby maintaining, in accordance with the variation of the resistance thereof, the applied voltage applied to the internal circuit at the same level and a capacitor for negatively feeding back the applied voltage actually applied to the internal circuit to the control input terminal of the variable resistance element.

Accordingly, a follow-up characteristic of a power circuit of this type with respect to an instantaneous variation (noise) of the internal circuit applied voltage $V_{DD}$ can be improved without increasing the idling current of .the variable resistance element driver.

BRIEF DESCRIPTION OF THE DRAWINGS

FIG. 4, comprising parts (a) and (b), is an illustration of waveforms showing variations of the states of each node due to internal circuit noise;

DETAILED DESCRIPTION OF THE INVENTION

Figure 1:
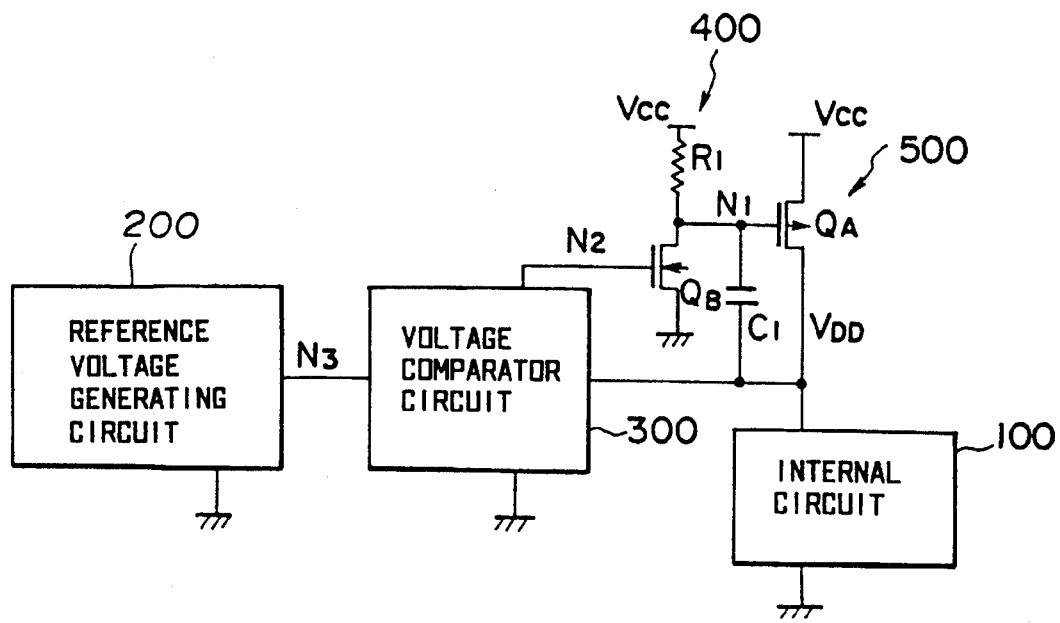
FIG. 1 is a diagram illustrating an embodiment of the present invention.

FIG. 1 is a diagram illustrating an embodiment of the present invention. Referring to FIG. 1, a reference voltage generating circuit 200, which is a reference voltage generating source for generating a reference voltage $N_3$ that serves as a reference for a voltage applied to an internal load circuit 100 (embodied, for example, by an SRAM as mentioned in the following), is connected to a voltage comparator circuit 300 which compares the reference voltage $N_3$ with an applied voltage $V_{DD}$ (3V, normally) actually applied to the internal circuit 100.

The voltage comparator 300 is connected to a resistance element driver 400 which drives a variable resistance element $Q_A$ (mentioned in the following) in accordance with an output signal $N_2$ of the comparator, thereby maintaining the applied voltage $V_{DD}$ applied to the internal circuit 100 at the same level. As shown in FIG. 1, this resistance element driver 400 comprises a resistance element $R_1$ and an n-channel MOSFET $Q_B$, arranged in that order, when viewed from the external power supply voltage $V_{CC}$. The resistance element $R_1$ can be a p-channel MOSFET.

A variable resistance element 500, with a resistance varying in response to a signal fed to a control input terminal $N_1$, is inserted in a line supplying power to the internal circuit 100, the line leading from the external power supply voltage $V_{CC}$. This variable resistance element 500 comprises the p-channel MOSFET $Q_A$, as shown in FIG 1. A p-channel MOSFET is used in order to maintain the internal potential and the external potential of the internal circuit 100 at the same level.

A capacitor $C_1$ (100 pF, for example) is provided between the gate and the drain of the p-channel MOSFET $Q_A$, for negatively feeding back the applied voltage $V_{DD}$, actually applied to the internal circuit 100, to the gate of the p-channel MOSFET $Q_A$ (the gate embodying the control input terminal $N_1$ of the variable resistance element 500).

In such a power circuit, when the voltage $V_{DD}$ (3V, normally) applied to the internal circuit, undergoes a relatively moderate change due to such causes as the variation of the externally supplied power source voltage $V_{CC}$ (5V, normally) or the operation of the internal circuit, a negative feedback is applied to the variable resistance element 500 (the p-channel MOSFET $Q_A$) via the voltage comparator 300 and the variable resistance element driver 400.

A rapid negative feedback is applied to the variable resistance element 500 (the p-channel MOSFET $Q_A$) via the capacitor $C_1$ in response to an instantaneous variation (noise) in the internal circuit applied voltage $V_{DD}$, which variation is due to the operation of the internal circuit 100, for example.

In this way, a follow-up characteristic with respect to an instantaneous variation (noise) in the applied voltage $V_{DD}$ of the internal circuit 100 can be improved without increasing the idling current of the resistance element driver 400.

Figure 2:
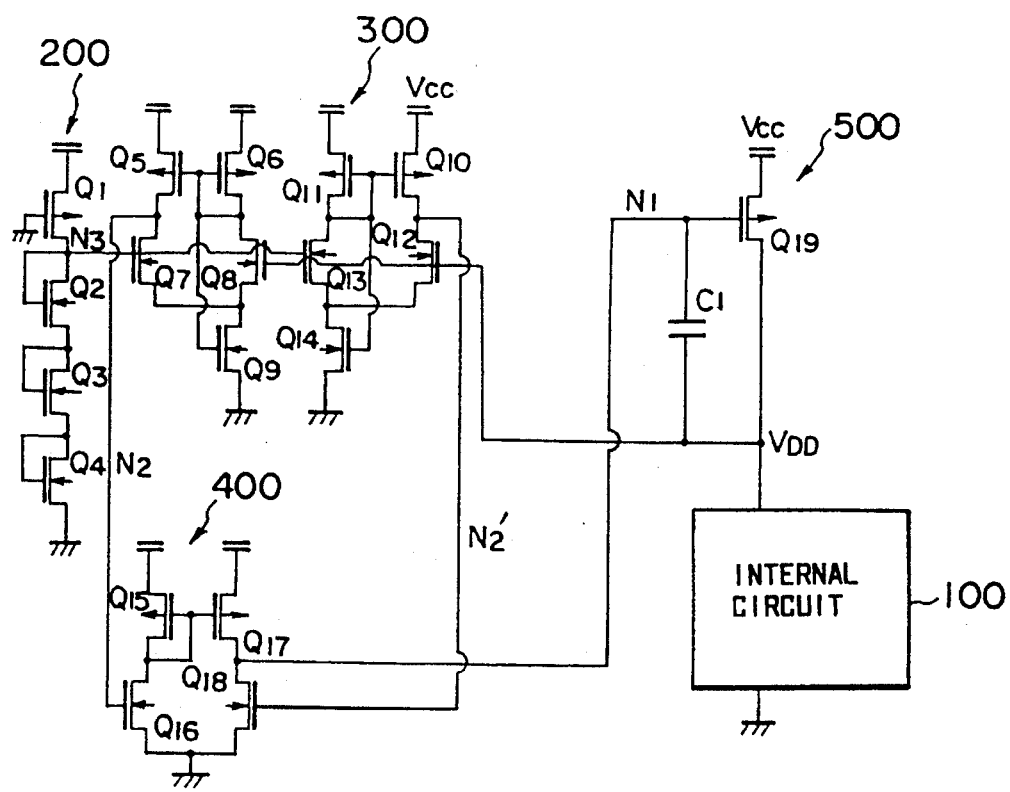
FIG. 2 is a diagram illustrating examples of a reference voltage generating circuit, a voltage comparator circuit, and a variable resistance element driver of FIG. 1.

FIG. 2 illustrates examples of the reference voltage generating circuit, the voltage comparator circuit, and the resistance element driver of FIG. 1.

A p-channel MOSFET $Q_{19}$ ($Q_A$), with a source terminal connected to the external power source voltage $V_{CC}$ and a drain terminal connected to the internal circuit 100, is used as the variable resistance element 500, the gate terminal of the same MOSFET being supplied with a driving signal $N_1$ mentioned later.

The reference voltage generating circuit 200 is embodied by a constant-voltage circuit comprising an n-channel MOSFET series of three serially connected MOSFETs $Q_2$–$Q_4$, the gates and the sources thereof being connected so as to manifest the function of a resistance element, and by a p-channel MOSFET $Q_1$, having a drain terminal connected to an end of the n-channel MOSFET series $Q_2$–$Q_4$, and a gate terminal connected to earth so as to manifest the function of a constant current source. The reference voltage $N_3$ is obtained at the point where the p-channel MOSFET $Q_1$ and the n-channel MOSFET series $Q_2$–$Q_4$ are connected.

The voltage comparator 300 is embodied by a differential amplifier comprising two pairs of p-channel MOSFETs of symmetrical characteristics, namely ($Q_5$ and $Q_{10}$) and ($Q_6$ and $Q_{11}$) and of three pairs of n-channel MOSFETs of symmetrical characteristics, namely ($Q_7$ and $Q_{12}$), ($Q_8$ and $Q_{13}$), and ($Q_9$ and $Q_{14}$). This configuration is of a so-called current mirror sense amplifier. This differential amplifier compares the reference voltage $N_3$ supplied to the gate terminals of the MOSFET $Q_7$ and the MOSFET $Q_{13}$, and the power source voltage $V_{DD}$ supplied to the gate terminals of the MOSFET $Q_8$ and the MOSFET $Q_{12}$, the result of the comparison being output, as comparison result signals $N_2$ and $N_2'$, from the point where the MOSFET $Q_5$ and the MOSFET $Q_7$ are connected and from the point where the MOSFET $Q_{10}$ and the MOSFET $Q_{12}$ are connected, respectively.

The variable resistance element driver 400 is embodied by an amplifier circuit comprising a pair of n-channel MOSFET's ($Q_{15}$ and $Q_{17}$) of symmetrical characteristics and of a pair of n-channel MOSFET's ($Q_{16}$ and $Q_{18}$) of symmetrical characteristics. This The variable resistance element driver 400 amplifies the comparison result signals $N_2$ and $N_2'$, supplied to the gate terminals of the MOSFET $Q_{16}$ and the MOSFET $Q_{18}$, and supplies, as a driving signal $N_1$, the amplified signal to the gate terminal of the MOSFET $Q_{19}$ functioning as the variable resistance element 500.

One end of the capacitor $C_1$, which is the essential part of the present invention, is connected to the point where the internal circuit 100 and the p-channel MOSFET $Q_{19}$ functioning as the variable resistance element 500 are connected, i.e., the drain terminal of the p-channel MOSFET $Q_{19}$, and the other end of the capacitor $C_1$ is connected to the gate terminal of the p-channel MOSFET $Q_{19}$ functioning as the variable resistance element 500.

Accordingly, when the applied voltage $V_{DD}$ applied to the internal circuit 100 shows signs of rapidly increasing, the potential difference between the gate and the source of the p-channel MOSFET $Q_{19}$ functioning as the variable resistance element 500 becomes small, and the source-drain resistance of the p-channel MOSFET $Q_{19}$ increases so that the increase of the applied voltage $V_{DD}$ applied to the internal circuit 100 is instantly checked. When the applied voltage $V_{DD}$ applied to the internal circuit 100 shows signs of rapidly dropping, the gate-source potential difference of the p-channel MOSFET $Q_{19}$ functioning as the variable resistance element 500 becomes great and the source-drain resistance of the p-channel MOSFET $Q_{19}$ decreases so that the drop of the applied voltage $V_{DD}$ applied to the internal circuit 100 is instantly checked.

Figure 3B:
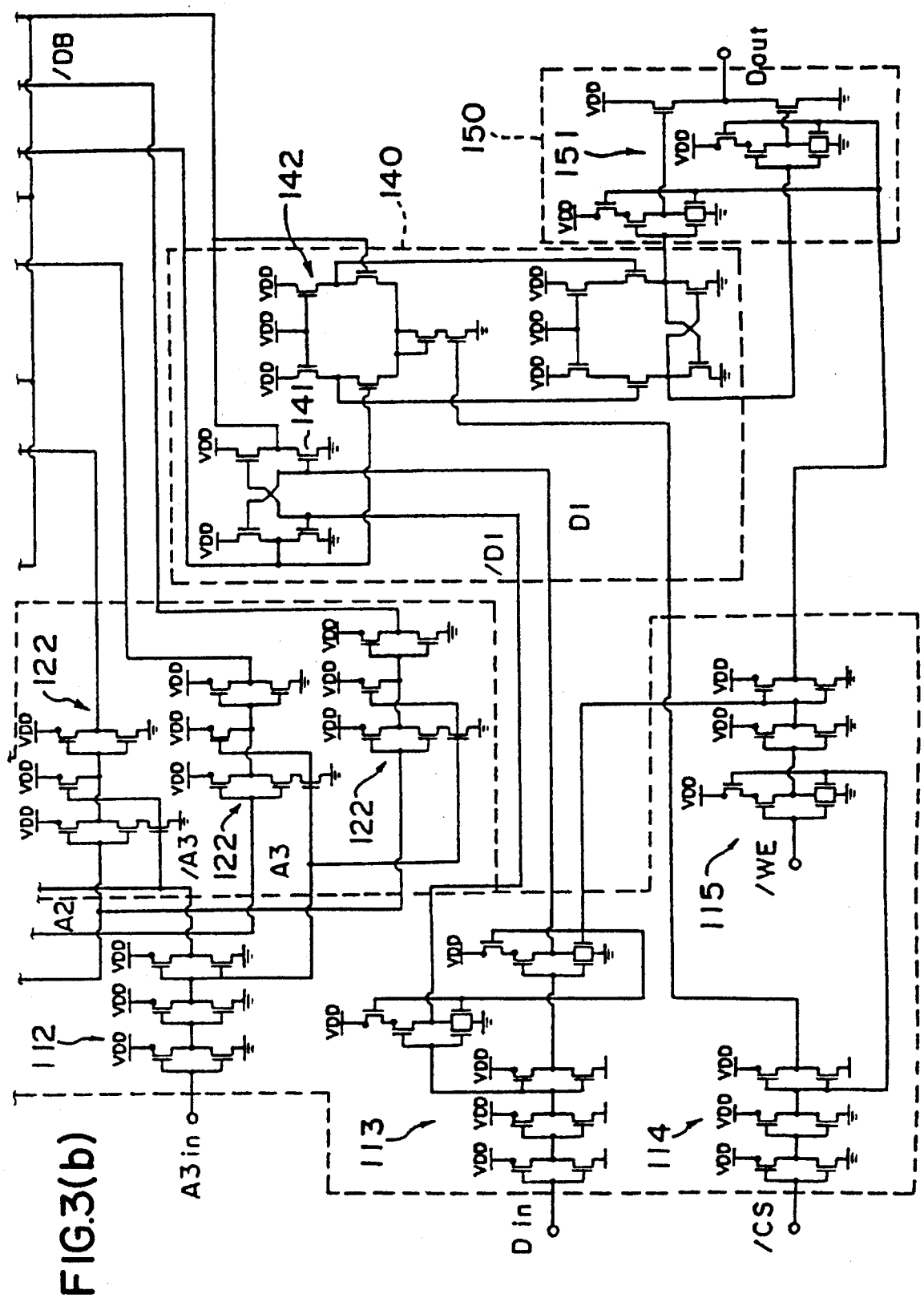
FIGS. 3(a) and (b) are diagrams illustrating an example of an internal circuit of FIG. 1.

FIGS. 3(a) and 3(b) illustrate an example of the internal circuit of FIG. 1. The lines extending to the bottom of FIG. 3(a) continue at the top of FIG. 3 (b). The internal circuit 100 in FIGS. 3(a) and 3(b) is a basic circuit of an SRAM (static RAM).

In FIGS. 3(a) and 3(b), 110 represents an input buffer, 120 a decoder, 130 a cell array, 140 an amplifier, and 150 an output buffer.

The input buffer 110 is fed with inputs of address signals A0–A3, a data D, chip select signal CS and an enable signal WE, and comprises of a row address buffer circuit 111, a column address buffer circuit 112, a data-in buffer circuit 113, a chip select buffer circuit 114, and a write enable buffer circuit 115.

The decoder 120 consists of a row decoder 121 and a column decoder 122, and selects a cell of the cell array 130 on the basis of an address signal.

The cell array 130 is where memory cells 131 (sixteen of them are shown in the figure) are arranged in the form of a matrix.

The amplifier 140 comprises of a write amplifier circuit 141 and two read sense amplifier circuits 142.

The output buffer 150 comprises of a data-out buffer 151 for outputting the read data.

Circuit elements in the circuits described above constituting the internal circuit 100 in the form of an SRAM are driven by the power supply voltage $V_{DD}$.

FIGS. 4(*a*) and 4(*b*) are illustrations of waveforms showing variation of the states of each node, the variation due to noise of the internal circuit. FIG. 4(*a*) is a waveform illustration for a conventional circuit, FIG. 4(*b*) is a waveform illustration for the present invention, and a description of a comparison between the two is given below.

As is shown in FIG. 4(*a*), in the conventional circuit, when the internal circuit applied voltage $V_{DD}$ shows signs of a sharp drop, due to a rapid increase of power consumption in the internal circuit 100, at time $t_1$ accompanied by a rapid increase of the comparison result signal $N_2$, the drop of the driving signal $N_1$ is more moderate than the increase of the comparison result signal $N_2$, due to the delay in the operation of the variable resistance element driver 400. As a result, it takes a comparatively long time for the value of the internal circuit applied voltage $V_{DD}$ to return to the original state.

Similarly, when the internal circuit applied voltage $V_{DD}$ shows signs of a rapid increase due to a rapid drop of power consumption in the internal circuit 100, at time $t_2$, accompanied by a rapid drop of the comparison result signal $N_2$, the increase of the driving signal $N_1$ is more moderate than the drop of the comparison result signal $N_2$, due to the delay in the operation of the variable resistance element driver 400. As a result, it takes a comparatively long time for the value of the internal circuit applied voltage $V_{DD}$ to return to the original state.

On the other hand, FIG. 4(*b*) shows that, in the circuit of this embodiment, when the internal circuit applied voltage $V_{DD}$ shows signs of a rapid drop due to a rapid increase of power consumption of the internal circuit 100, at time $t_1$, the accompanied increase of the comparison result signal $N_2$ is the same as that of the conventional circuit, but the driving signal $N_1$ shows an instantaneous drop at a greater rate than in the conventional circuit by virtue of the application of a rapid negative feedback effect of the capacitor $C_1$. As a result, it takes a comparatively short time for the value of the internal circuit applied voltage $V_{DD}$ to return to the original state.

Similarly, when the internal circuit applied voltage $V_{DD}$ shows signs of a rapid increase due to a rapid drop of power consumption in the internal circuit 100, at time $t_2$, the accompanied drop of the comparison result signal $N_2$ is the same as that of the conventional circuit, but the driving signal $N_1$ shows an instantaneous increase at a greater speed than in the conventional circuit by virtue of a rapid negative feedback effect of the capacitor $C_1$. As a result, it takes a comparatively short time for the value of the internal circuit applied voltage $V_{DD}$ to return to the original state.

Figure 5:
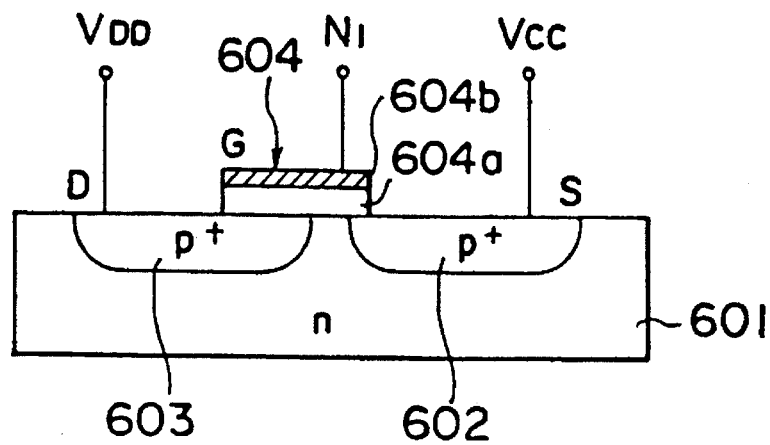
FIG. 5 is a schematic cross-sectional view of a p-channel MOSFET provided with a capacitor, the MOSFET being used in a semiconductor apparatus including the power circuit of the present invention.

While it is possible to provide the p-channel MOSFETs $Q_A$ ($Q_{19}$) and the capacitor $C_1$ separately and connect them afterwards, it is also possible to form them as one element as is shown in FIG. 5.

FIG. 5 is a schematic cross-sectional view of a p-channel MOSFET provided with a capacitor, the MOSFET being used in a semiconductor apparatus including a power circuit of the present invention.

The p-channel MOSFETs $Q_A$ and $Q_{19}$, shown in FIGS. 1 and 2, respectively, are fabricated such that a high-density source area 602 (high-density indicating that the source area 602 has a high impurity concentration) and a drain area 603 are formed on the face of an n-type silicon base 601 by means of ion implantation, for example.

When the gate electrode 604 is a so-called poly-side gate, a polycrystalline silicon film 604*a*, a part of constituting the gate electrode 604, is formed on the surface of a gate oxide film between the source area 602 and the drain area 603. A metal electrode film 604*b* is then formed on the polycrystalline silicon film 604*a* by deposition, for example.

The polycrystalline silicon film 604*a* should be formed such that it is in extensive contact with the drain area 603. The gate-drain electric capacitance is determined in correspondence with this contact area. The state of the circuit thus prepared becomes virtually the same as when the capacitor $C_1$ is connected between the gate and the drain.

The external power source voltage $V_{CC}$ is applied to the source area 602, and the drain area 603 supplies the internal power source voltage $V_{DD}$ in accordance with the driving signal $N_1$ input into the gate 604.

Figure 6:
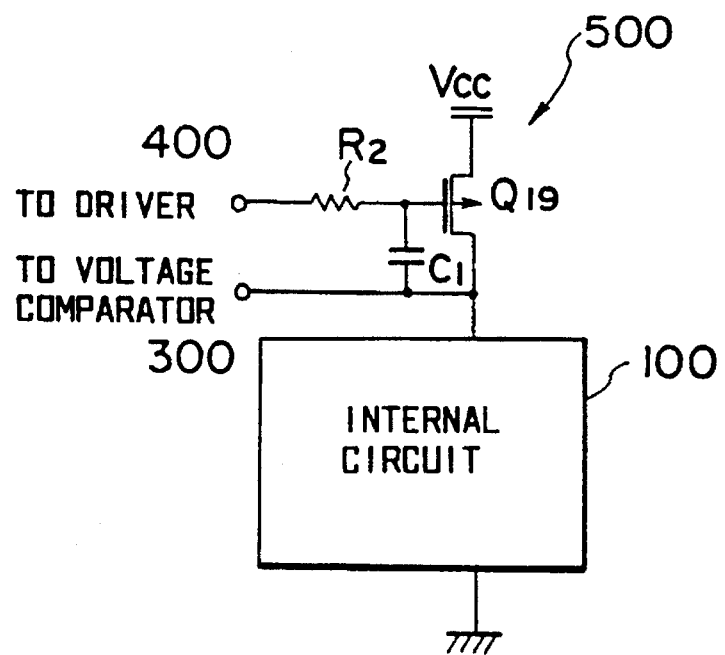
FIG. 6 is a diagram illustrating another embodiment of the present invention.

FIG. 6 is a diagram illustrating another embodiment of the present invention. One notable difference shown in FIG. 6 is that a resistance element $R_2$ is inserted in a signal line leading from the variable resistance element driver 400 to the gate terminal of transistor $Q_{19}$, while the other configurations remain the same as in FIG. 2. This resistance element $R_2$ acts to absorb the noise superimposed on a feedback signal from the variable resistance element driver 400 so that the feedback effect of the capacitor $C_1$ is augmented.

POSSIBLE APPLICATION IN THE INDUSTRY

As has been described, a power circuit of the present invention is useful when it is intended that there should be a close follow-up on an instantaneous variation (noise) of the internal circuit applied voltage without increasing an idling current of the variable resistance element driver.

I claim:

1. A power circuit supplying a power supply voltage, from a power supply source and through a power supplying line to a power supply input terminal of a load, the power supply circuit comprising:

a variable resistance element having a control input terminal and inserted in the power supplying line leading to the load, the value of resistance thereof varying in response to a signal input into the control input terminal thereof;

a reference voltage generating source for generating and outputting a reference voltage;

a comparator which compares the power supply voltage with the reference voltage and produces a comparator output signal which varies in accordance with variations of the power supply voltage relative to the reference voltage;

a variable resistance element driver having a driver output terminal and responsive to the comparator output signal produced by said comparator and which produces a corresponding drive output signal, output from the driver output terminal, which varies in accordance with variations in the comparator output signal, the drive output signal being applied to the input control terminal of said variable resistance element and correspondingly varying the value of resistance thereof, thereby to maintain the power supply voltage applied to said load at a desired level;

a capacitor connected between the power supply input terminal of the load and the control input terminal of the variable resistance element, operable for negatively feeding back variations in the power supply voltage applied to said load to the control input terminal of said variable resistance element; and a first resistance element connected between the driver output terminal of the variable resistance element driver and the control input terminal of the variable resistance element and augmenting the negative feedback of said capacitor.

2. A power circuit as claimed in claim 1, wherein said load comprises a memory circuit.

3. A power circuit as claimed in claim 1, wherein said comparator comprises a current mirror sense amplifier.

4. A power circuit as claimed in claim 1, wherein said variable resistance element driver comprises:

a second resistance element having a first terminal connected to the power supply source and a second terminal connected to the driver output terminal;

an n-channel transistor connected between the driver output terminal and ground potential, said n-channel transistor being turned on and off in accordance with said comparator output signal.

5. A power circuit as claimed in claim 1, wherein:

said variable resistance element and said capacitor are integrally formed on a single MOS element, said MOS element comprising:

a base of a semiconductor material of a first conductivity type and having a major surface, a source area and a drain area formed therein, from the major surface thereof, and each of the source area and the drain area being of a second conductivity type opposite to the first conductivity type, and a gate formed on the major surface of the base and extending between said source area and said drain area and in extensive contact with said drain area so as to provide an electric capacitance between said drain area and said gate.

6. A power circuit as claimed in claim 2, wherein said comparator comprises a current mirror sense amplifier.

7. A power circuit as claimed in claim 2, wherein said variable resistance element driver comprises:

a second resistance element having a first terminal connected to the power supply source and a second terminal connected to the driver output terminal;

an n-channel transistor connected between the driver output terminal and ground potential, said n-channel transistor being turned on and off in accordance with said comparator output signal.

8. A power circuit as claimed in claim 3, wherein said variable resistance element driver comprises:

a second resistance element having a first terminal connected to the power supply source and a second terminal connected to the driver output terminal;

an n-channel transistor connected between the driver output terminal and ground potential, said n-channel transistor being turned on and off in accordance with said comparator output signal.

9. A power circuit as claimed in claim 2, wherein:

said variable resistance element and said capacitor are integrally formed on a single MOS element, said MOS element comprising:

a base of a semiconductor material of a first conductivity type and having a major surface, a source area and a drain area formed therein, from the major surface thereof, and each of the source area and the drain area being of a second conductivity type opposite to the first conductivity type, and a gate formed on the major surface of the base and extending between said source area and said drain area and in extensive contact with said drain area so as to provide an electric capacitance between said drain area and said gate.

10. A power circuit as claimed in claim 3, wherein:

said variable resistance element and said capacitor are integrally formed on a single MOS element, said MOS element comprising:

a base of a semiconductor material of a first conductivity type and having a major surface, a source area and a drain area formed therein, from the major surface thereof, and each of the source area and the drain area being of a second conductivity type opposite to the first conductivity type, and a gate formed on the major surface of the base and extending between said source area and said drain area and in extensive contact with said drain area so as to provide an electric capacitance between said drain area and said gate.

11. A power circuit as claimed in claim 4, wherein:

said variable resistance element and said capacitor are integrally formed on a single MOS element, said MOS element comprising:

a base of a semiconductor material of a first conductivity type and having a major surface, a source area and a drain area formed therein, from the major surface thereof, and each of the source area and the drain area being of a second conductivity type opposite to the first conductivity type, and a gate formed on the major surface of the base and extending between said source area and said drain area and in extensive contact with said drain area so as to provide an electric capacitance between said drain area and said gate.

* * * * *